(12) United States Patent
Beat

(10) Patent No.: US 7,136,985 B2
(45) Date of Patent: Nov. 14, 2006

(54) METHOD AND SYSTEM FOR FAST DATA ACCESS USING A MEMORY ARRAY

(75) Inventor: Robert Beat, Bristol (GB)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/894,027

(22) Filed: Jul. 20, 2004

(65) Prior Publication Data
US 2004/0266027 A1    Dec. 30, 2004

Related U.S. Application Data

(63) Continuation of application No. 10/178,269, filed on Jun. 25, 2002, now Pat. No. 6,789,179.

(60) Provisional application No. 60/301,435, filed on Jun. 29, 2001.

(51) Int. Cl.
*G06F 12/06* (2006.01)
(52) U.S. Cl. ...................................................... 711/201
(58) Field of Classification Search ................ 711/154, 711/201
See application file for complete search history.

(56) References Cited
U.S. PATENT DOCUMENTS
3,440,615 A    4/1969   Carter

| 4,814,976 A | * | 3/1989  | Hansen et al. ............... 711/201 |
| 5,566,312 A |   | 10/1996 | Pedneau |
| 6,076,136 A |   | 6/2000  | Burroughs et al. |
| 6,539,467 B1 |  | 3/2003  | Anderson et al. |
| 6,553,474 B1 |  | 4/2003  | Ito et al. |
| 6,658,547 B1 |  | 12/2003 | Reynolds et al. |

OTHER PUBLICATIONS

European Search Report for European Application No. EP 02 25 4514, mailed Sep. 21, 2004, European Patent Office, The Hague.

\* cited by examiner

*Primary Examiner*—Kevin L. Ellis
(74) *Attorney, Agent, or Firm*—Sterne, Kessler, Goldstein & Fox, P.L.L.C.

(57) ABSTRACT

First and second address-selection information, as well as first and second read/write information, is contemporaneously provided to various enabling circuits. The enabling circuits can then enable one or more first memory cells based on the first address-selection and first read/write information, and further enable the one or more second memory cells based on the second address-selection information and read/write information. Data can then be written to, or read from, the enabled memory cells in a single memory-access cycle.

14 Claims, 10 Drawing Sheets

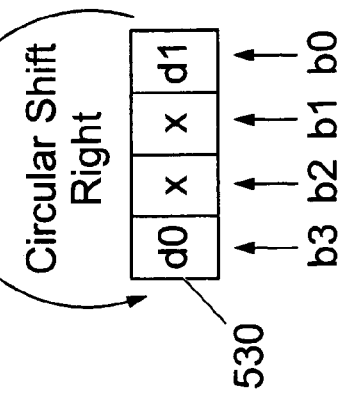
Shifted Data=(d0 x x d1) *x = don't care
Read Enable Even = "1000"; @ addr=00000
Read Enable Odd = "0001"; @ addr=00100
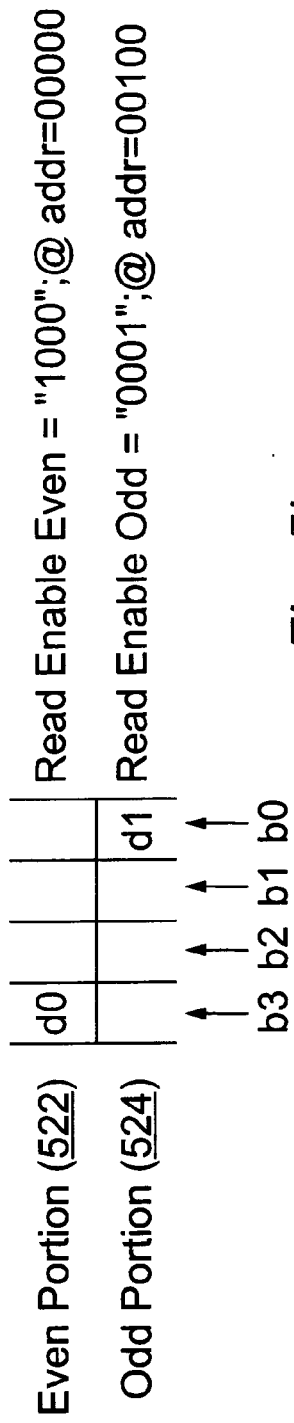
*Fig. 5b*
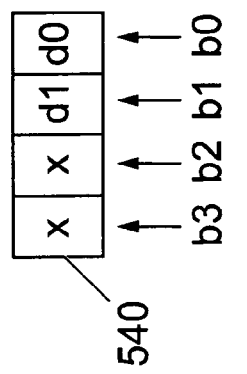
*Fig. 5c*
*Fig. 5d*

METHOD AND SYSTEM FOR FAST DATA ACCESS USING A MEMORY ARRAY

CROSS-REFERENCE TO RELATED APPLICATION

This application is a continuation of U.S. application Ser. No. 10/178,269, filed Jun. 25, 2002, now issued as U.S. Pat. No. 6,789,179, which claims priority to Provisional U.S. patent application Ser. No. 60/301,435, filed Jun. 29, 2001, which is incorporated herein by reference in its entirety.

BACKGROUND OF THE INVENTION

1. Field of the Invention

This invention relates to methods and systems for fast access of computer-based memories.

2. Related Art

Modern computer-based systems often use wide memories that have a constant width. However, these systems must often manipulate a variety of variables having different data widths. For instance, a particular processor can have a thirty-two bit (four byte) wide bus with a thirty-two bit-wide random access memory (RAM), but must manipulate any number of variables having eight bit (one byte), sixteen bit (two bytes) or thirty-two bit widths.

One problem that can arise with such systems is that data can become misaligned with the physical boundaries of the available memory. For example, a first variable in a block of thirty-two bit-wide RAM may be a byte-wide variable while a second variable may be a four-byte variable. As a result, the first variable will occupy the first byte of a first memory location, while the second variable will occupy the remaining three bytes of the first memory location plus the first byte of the next memory location. One unfortunate consequence of this situation is that a computer accessing the second variable can take two separate memory-access cycles to either read or write the second variable.

While various approaches are available to align various variables having different bit-widths with the address boundaries of a memory, these approaches typically require a wasteful use of available memory resources or otherwise cannot be used with practicable systems. Accordingly, new technologies that can eliminate multiple-cycle memory accesses for misaligned data are desirable.

SUMMARY OF THE INVENTION

The invention provides techniques directed to accessing misaligned data words in an array of memory cells. In various embodiments, techniques directed to reading a misaligned data variable are provided where a first portion of the misaligned data variable resides in one or more first memory cells associated with a first address and a second portion of the misaligned data variable resides in one or more second memory cells associated with a second address.

By contemporaneously providing first and second address-selection information as well as first and second read information, enabling circuits can read-enable one or more of the first memory cells based on the first address-selection and first read information, and further read-enable the one or more of the second memory cells based on the second address-selection information and second read information. The data from the enabled memory cells can then be received and assembled by a device, such as buffer circuitry, optionally shifted, then provided to an external device.

In various other embodiments, techniques directed to writing a misaligned data variables are provided where a first portion of the misaligned data variable is directed to one or more first memory cells associated with a first address and a second portion of the misaligned data variable is directed one or more second memory cells associated with a second address.

By contemporaneously providing first and second address-selection information as well as first and second write information, enabling circuits can write-enable one or more of the first memory cells based on the first address-selection and first write information, and further write-enable the one or more of the second memory cells based on the second address-selection information and second write information. Meanwhile, a device, such as buffer circuitry, can receive the misaligned data variable from an external source, appropriately shift the misaligned data variable and provide the shifted data of the misaligned data variable to the write-enabled memory cells of the two memory locations.

Accordingly, data access operations that would take two memory-access cycles on a conventional memory system are reduced to using a single memory-access cycle. Others features and advantages will become apparent in the following descriptions and accompanying figures.

BRIEF DESCRIPTION OF THE DRAWINGS

The invention is described in detail with regard to the following figures, wherein like numerals reference like elements, and wherein:

FIGS. 5A–5D depict a second memory access operation according to the present invention;

DETAILED DESCRIPTION OF THE INVENTION

Figure 1:
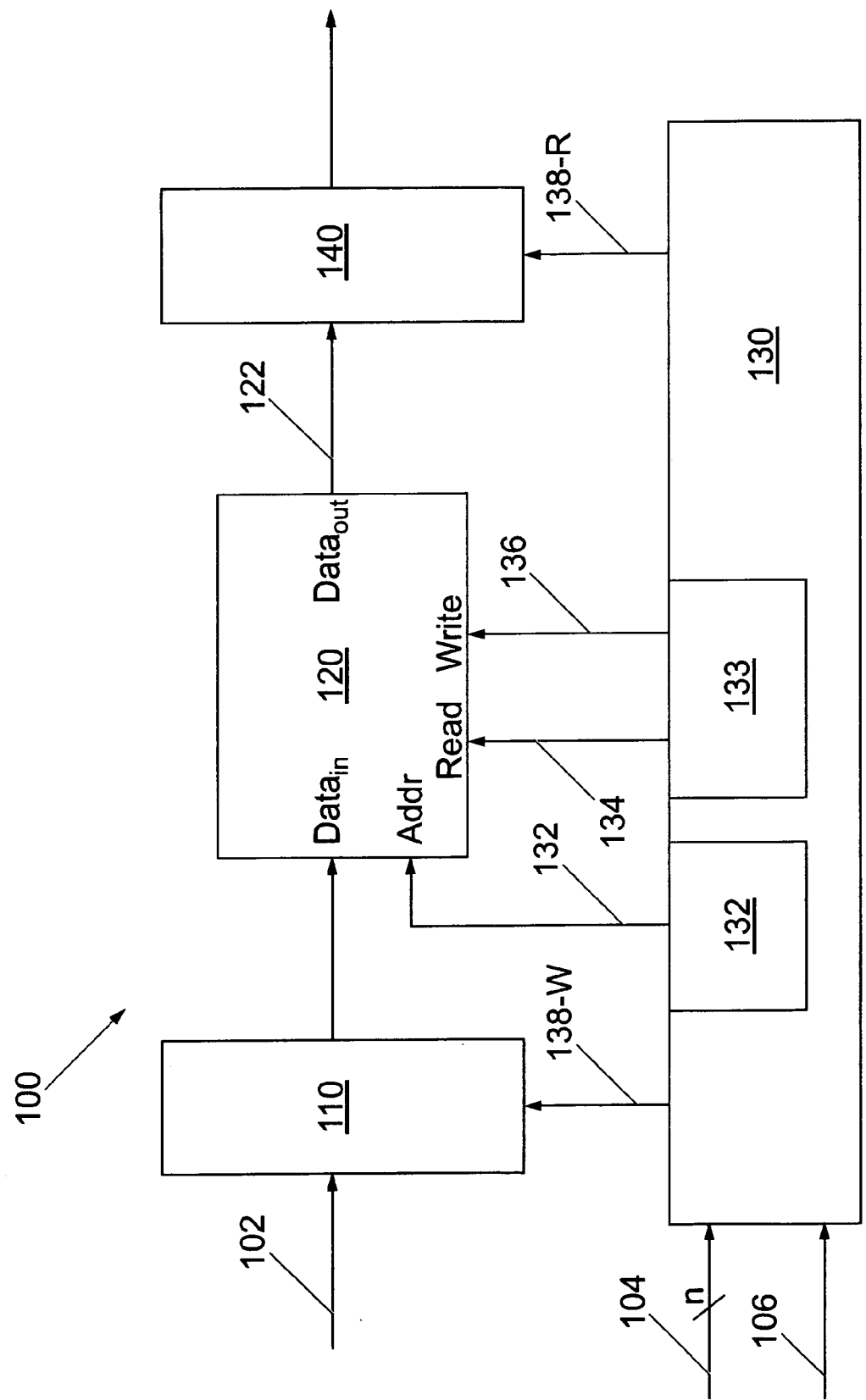
FIG. 1 is a block diagram of an exemplary system capable of accessing misaligned data in a single memory-access cycle.

A frequent problem that arises with modern computer-based systems is that, while the widths of an available physical memory are fixed, the widths of various data types can vary. For example, a particular microcomputer may have a thirty-two bit-wide memory, but may be required to access and manipulate eight-bit, sixteen-bit and thirty-two bit data. One problem that can arise with such systems is that different variables can become misaligned with the address boundaries of the physical memories.

For instance, a first data variable in a block of thirty-two bit-wide RAM may be a byte-wide variable while a second data variable may be a four-byte variable. As a result, the first data variable will occupy the first byte of a first memory location, while the second data variable will occupy the remaining three bytes of the first memory location plus the first byte of the next memory location. One unfortunate consequence of this situation is that a computer accessing the second data variable can take two separate memory-access cycles to either read or write the second variable.

However, by providing a memory array that allows contemporaneous access to two consecutive memory locations, e.g., the first and second memory locations, and that can simultaneously receive an array of read/write enable signals for the various bytes of both the even and odd memory addresses of the memory array, the misaligned data variable can be written to or read from the memory array in a single memory-access cycle. Using the example immediately above, the second data variable (represented by data bytes {d3, d2, d1, d0}) is misaligned such that the low three data variable bytes {d2, d1, d0} must be written to or read from the high three bytes {$b_0$3, $b_0$2, $b_0$1} of memory location zero and the high data variable byte {d3} must be written to or read from to the low byte {$b_1$0} of memory location one. That is, data variable bytes {de, d2, d1, d0} must be written to or read from memory bytes {$b_1$0, $b_0$3, $b_0$2, $b_0$1} respectively.

Accordingly, by enabling the consecutive address selection signals for both of memory location zero (an even address) and memory address one (an odd address), and further providing arrays of even and odd write-enable signals {$WE_{even}$[3], $WE_{even}$[2], $WE_{even}$[1], $WE_{even}$[0]} and {$WE_{odd}$[3], $WE_{odd}$[2], $WE_{odd}$[1], $WE_{odd}$[0]}, the second data variable can be written to the memory array if the second data variable {d3, d2, d1, d0} were circular-shifted to {d0, d3, d2, d1}, write-enable signals $WE_{even}$[3], $WE_{even}$[2], $WE_{even}$[1] and $WE_{odd}$[0] are active and write-enable signals $WE_{odd}$[3], $WE_{odd}$[2], $WE_{odd}$[1], and $WE_{even}$[0] are inactive.

Similarly, misaligned data variables can be read by the enabling consecutive address selection signals for both of memory location zero and memory address one, providing the requisite active read-enable signals for the two memory locations, i.e., $RE_{even}$[3], $RE_{even}$[2], $RE_{even}$[1] and $RE_{odd}$[0], reading the enabled bytes, appropriately combining the data from enabled bytes, and then circular-shifting the combined data from {d0, d3, d2, d1} to {d3, d2, d1, d0}.

FIG. 1 is a block diagram of a memory system 100 capable of accessing misaligned data in a single memory-access cycle. As shown in FIG. 1, the system 100 includes a first data buffer block 110, a second data buffer block 140, a memory array 120 and an address device 130. The address device 130 in turn contains an address-selection device 132 and a cell-enable device 133.

For the purposes of the following discussion, the exemplary memory array 120 can have 262,144 ($2^{18}$) separately addressable memory locations with each memory location containing four byte-wide cells {b3, b2, b1, b0}. However, it should be appreciated that, in various embodiments, the number of addressable memory locations as well as the width of the individual memory locations/cells can vary without departing from the spirit and scope of the present invention.

In a first operation, an external device (not shown) can write a misaligned data variable to the memory system 100 in a single memory-access cycle. During the operation, the external device can provide a data variable to the first data buffer block 110 via link 102, and further provide address and control signals to the address device 130 via links 104 and 106 respectively.

As the address device 130 receives the address and control signals, the address device 130 can make a determination whether a particular variable is misaligned, i.e., whether the particular data variable resides in, or is directed to, two separate memory locations of the memory array 120.

If a particular data variable is misaligned, the address device 130 can provide an offset to the first data buffer block 110 via link 138-W. For example, if a particular four-byte data variable is misaligned such that the first byte of the misaligned data variable is located at the third byte of a memory location, the address device 130 can provide an offset of two to the first data buffer block 110.

As the address device 130 provides the offset to the first data buffer 110, the address device 130 can further provide address-selection information, such as an array of address-enable signals, to the memory array 120. For example, if a data variable must be written to a portion of memory location 1000, the address device 130 can activate an address signal for that memory location. Furthermore, if the data variable must be written to a portion of memory location 1000 plus a portion of memory location 1001, the address device 130 can contemporaneously activate address signals for both memory locations.

As the address device 130 provides address-selection information, the cell-enable device 133 can provide write information to the memory array 120. The exemplary cell-enable device 133 can provide write information in the form of eight write-enable signals with four write-enable signals ($WE_{even}$) being directed to all of the memory cells having even addresses {0, 2, 4, 6, ...} and four write-enable signals ($WE_{odd}$) being directed to all of the memory cells having odd addresses {1, 3, 5, 7 ...}. Using the example above, assuming that a four-byte data variable is misaligned such that the low three data variable bytes {d2, d1, d0} must be written to the high three bytes {$b_0$3, $b_0$2, $b_0$1} of memory location zero and the remaining high byte {d3} must be written to the low byte {$b_1$0} of memory location one, the cell-enable device 133 can activate write-enable signals $WE_{even}$[3], $WE_{even}$[2], $WE_{even}$[1] and $WE_{odd}$[0] while keeping the remaining write-enable signals $WE_{odd}$[3], $WE_{odd}$[2], $WE_{odd}$[1], and $WE_{even}$[0] inactive.

As the address device 130 provides address, control and offset information, the first data buffer block 110 can receive the data variable along with the offset information, manipulate the data of the data variable and appropriately provide the manipulated data to the memory array 120. For example, if a received four-byte data variable is received has an offset of one, the first data buffer block 110 can shift the low three bytes of the data variable {d2, d1, d0} to the high bytes while shifting the high byte of the data variable {d3} to the low byte to form a modified data variable {d2, d1, d0, d3}. Once appropriately manipulated, the first data buffer block 110 can provide the modified data variable to the memory array 120 via the link connected therebetween.

As modified data variables are provided to the memory array 120, the memory array 120 can further receive address-selection information and write cell-enable information and appropriately store the data in the modified data variable. Again using the example above, assuming that a four-byte data variable is misaligned such that the low three data variable bytes {d2, d1, d0} must be written to the high three bytes {$b_0$3, $b_0$2, $b_0$1} of memory location zero and the high data variable byte {d3} must be written to the low byte {$b_1$0} of memory location one, the memory array 120 can receive a modified data variable {d2, d1, d0, d3} from the first data buffer block 110, receive address-selection signals for memory locations zero and one from the address-selection device 132 and receive write-enable information in the form of activated write-enable signals $WE_{even}$[3], $WE_{even}$[2], $WE_{even}$[1] and $WE_{odd}$[0] and inactive write-enable signals $WE_{odd}[3]$, $WE_{odd}[2]$, $WE_{odd}[1]$, and $WE_{even}[0]$. Once the data, address and enable information is received, the memory array 120 can appropriately store the data.

In a second operation, the system 100 can read a misaligned data variable from the memory array 120. During operation, as an external device provides the appropriate address and control signals via links 104 and 106 respectively, the address device 130 can receive the address and control signals, provide an offset to the second data buffer 140 via link 138-R, provide the appropriate address-selection information to memory array 120 via links 142 and further provide the appropriate read cell-enable information to memory array 120 via link 134.

The memory array 120 can receive the address-selection and read cell-enable information and provide the appropriate bytes of data to the second data buffer block 140 via link 122. The second data buffer block 140 in turn can receive the data bytes from the memory array 120 and combine the received data bytes into a single data variable taking into account the offset provided by the address device 130. For example, assuming that a four-byte data variable is read with the low two bytes provided from location zero and the high two bytes provided from location one (which assumes a data offset of two), the second data buffer block 140 can receive the various bytes of data, combine the various data bytes into a single contiguous data variable having four bytes, appropriately shift the combined data by two bytes and provide the combined/shifted data variable to an external device.

The exemplary first data buffer block 110 can be a portion of integrated circuit containing various logic circuits that can receive a data variable of a given size, effectively perform a circular-barrel shift/multiplexing operation on the received data variable and provide portions of the shifted/multiplexed data variable to the memory array 120. However, it should be appreciated that, in various embodiments, the first data variable can use any combination of elements, such as shifters, barrel shifters, multiplexers, various sum-of-products-based logic, or any other known or later developed combination of systems and devices that can receive a data variable, perform the equivalent of a shifting operation on the received data variable and provide the shifted data to the memory array 120 without departing from the spirit and scope of the present invention.

The second data buffer block 140, like the first data buffer 110, can be a portion of an integrated circuit containing various logic circuits. However, like the first data buffer block 110, it should be appreciated that the second data buffer block 140 can be any device capable of receiving various portions of data from multiple memories, combine the received data portions, and provide the combined data to an external device without departing from the spirit and scope of the present invention. Furthermore, in various embodiments, it should be appreciated that the functions of the first buffer block 110 and second buffer block 140 can be combined into a single buffering device and that the combined buffering device can interact with the memory array using a bi-directional bus system.

The address device 130, like the first and second data buffer blocks 110 and 140, can be a collection of logic circuits on a portion of an integrated circuit. However, it should be appreciated that the address device 130 can be any combination of systems and devices capable of receiving address and control signals from an external device and providing address-selection and enable information to memory array 120 as well as offset information to the data buffer blocks 110 and 130 without departing from the spirit and scope of the present invention.

Figure 2:
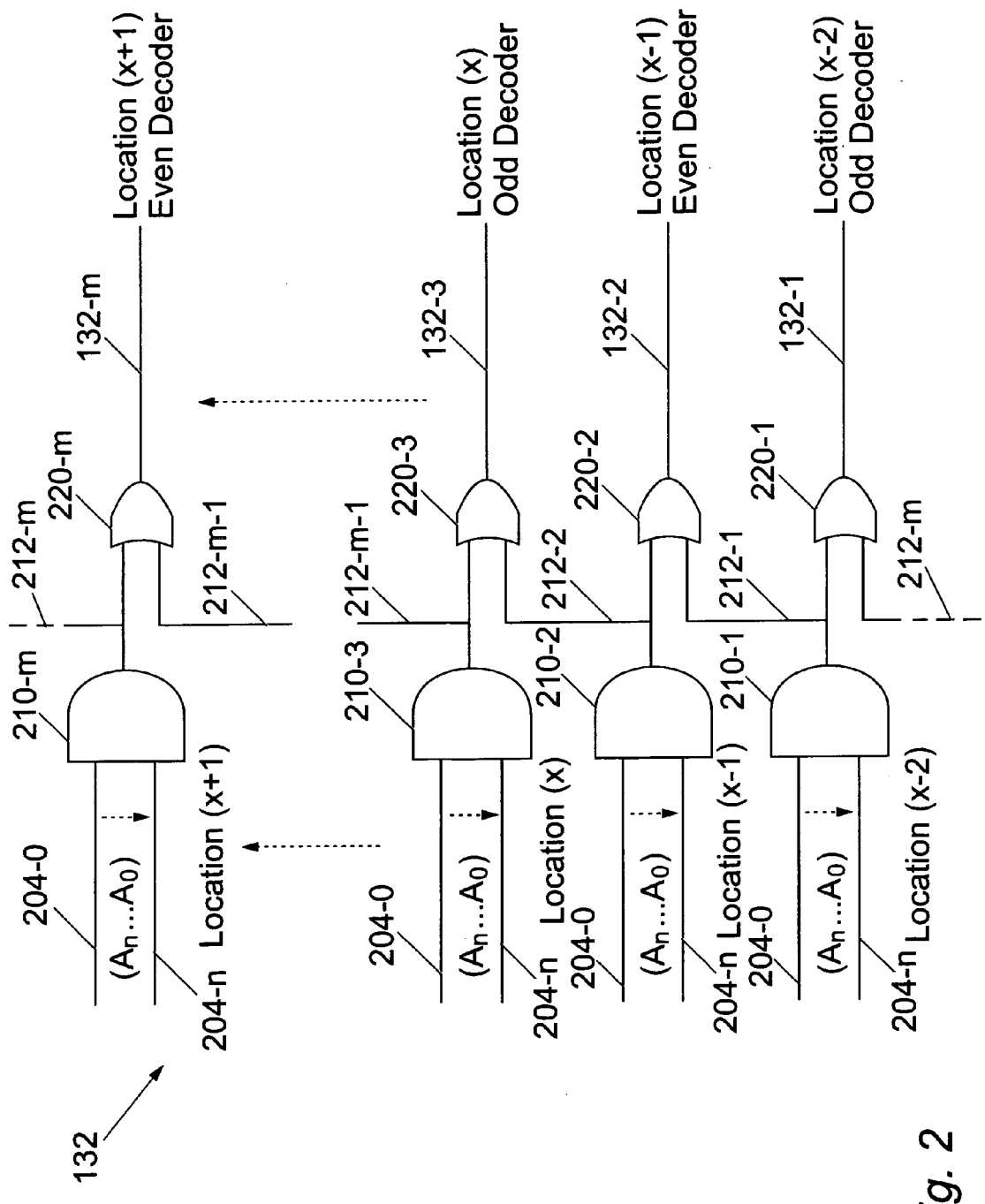
FIG. 2 depicts the location-enable device of the system of FIG. 1.

FIG. 2 depicts the address-selection device 132 of FIG. 1. As shown in FIG. 2, the address-selection device 132 contains a number of sequential address decoders 210-1, 210-2, . . . 210-m and a number of logical "OR" gates 220-1, 220-2 . . . 220-m. In operation, the address decoders 210-1, 210-2, . . . 210-m can receive an address $\{A_n \ldots A_0\}$ using address lines 204-0 . . . 204-n and provide address-selection signals $\{\ldots, x-2, x-1, x, x+1, \ldots\}$ to the "OR" gates 220-1, 220-2 . . . 220-m based on the received address. For example, if the received address is zero, then address decoder 210-1 $\{x-2\}$ can generate an active address signal, while the remaining address decoders 210-2, 210-3, . . . 210-m generate inactive address signals. Further, if the received address is one, then address decoder 210-2 $\{x-1\}$ can generate an active address signal. Still further, if the received address is two, then address decoder 210-3 $\{x\}$ can generate an active address signal, and so on.

As the appropriate address decoder generates an active address signal, the various address signals, active and inactive, are provided to the "OR" gates 220-1, 220-2. . . 220-m via links 212-1, 212-2, . . . 212-m. The "OR" gates 220-1, 220-2, . . . 220-m can receive the address signals and then provide address-selection signals to a device, such as a memory array via links 142-1, 142-2, . . . 142-m. Accordingly, for each address signal generated by an address decoder, two "OR" gates will generate an active address signal, then "OR" gates 220-2 and 220-3 will generate active address-selection signals. Similarly, in order to provide a memory wrap-around function, if address decoder 212-m generates an active address signal, then "OR" gates 220-m and 220-0 (not shown) will generate active address-selection signals as "OR" gate 220-0 receives an address signal from address decoder 210-m via link 212-m.

Figure 3:
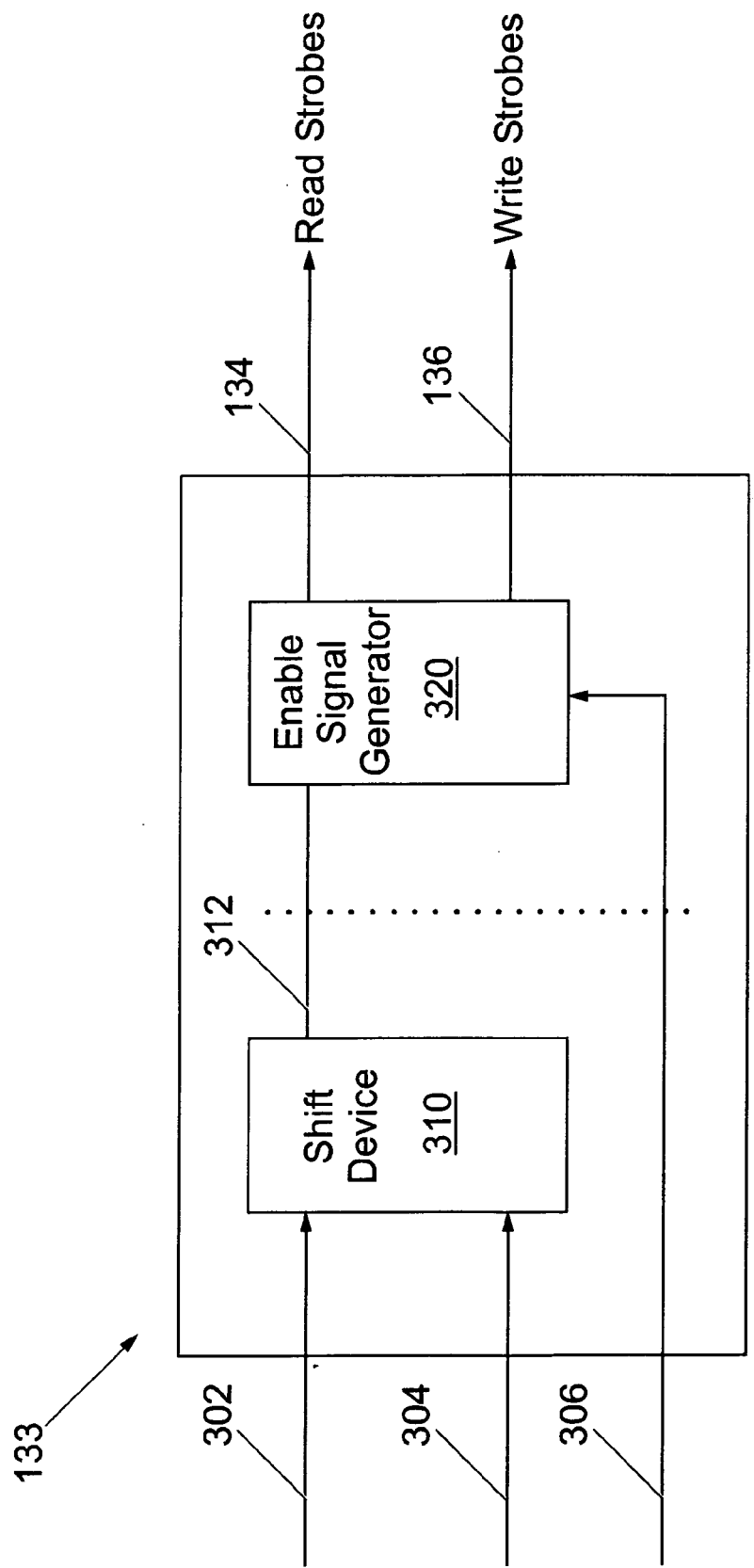
FIG. 3 is a block diagram of the cell-enable device of the system of FIG. 1.

FIG. 3 is a block diagram of the exemplary cell-enable device 133 of FIG. 1. As shown in FIG. 1, the cell-enable device 133 includes a shift device 310 and an enable signal generator 320. In operation, the shift device 310 can receive data strobe information via link 302 and offset information via link 304. The shift device 310 can then perform a circular-shift on the received strobe information according to the offset information. For example, if a misaligned two-byte data variable $\{0, 0, d1, d0\}$ is to be written/read, the shift device 310 can receive a four-bit strobe pattern of "0011". Assuming that the respective offset is three and the low byte $\{d0\}$ is to be written to an even address and $\{d1\}$ is to be written to an odd address, the shift device 310 can store the four-bit pattern in an eight-bit register to form a second pattern "0000 0011" and then circular-shift the second pattern three bits to the left to form a third pattern "0001 1000". The shift device 310 can then provide the third pattern to the enable signal generator 320 via link 312.

The enable signal generator 320 can receive the third strobe pattern, further receive a read/write indication via link 306, combine the third pattern and read/write indication and generate eight write-enable signals $\{WE_{odd}[3], WE_{odd}[2], WE_{odd}[1], WE_{odd}[0], WE_{even}[3], WE_{even}[2], WE_{even}[1], WE_{even}[0]\}$ and eight read-enable signals $\{RE_{odd}[3], RE_{odd}[2], RE_{odd}[1], RE_{odd}[0], RE_{even}[3], RE_{even}[2], RE_{even}[1], RE_{even}[0]\}$. Depending on the state of the read/write indication, only a subset of one of the write-enable signals or read-enable signals will be activated. For the example above, assuming the enable signal generator 320 receives a pattern of "0001 1000" and a write indication, only $WE_{odd}[0]$ and $WE_{even}[3]$ will activate while the remaining enable signals will remain inactive. Conversely, assuming the enable signal generator 320 receives a pattern of "0111

1000" and a read indication, only $RE_{odd}[2]$, $RE_{odd}[1]$, $RE_{odd}[0]$ and $RE_{even}[3]$ will activate.

Once the enable signals are generated, the read-enable strobes can be provided to a device, such as a memory array via link 134 and the write enable signals can be provided via link 136.

Figure 4A:
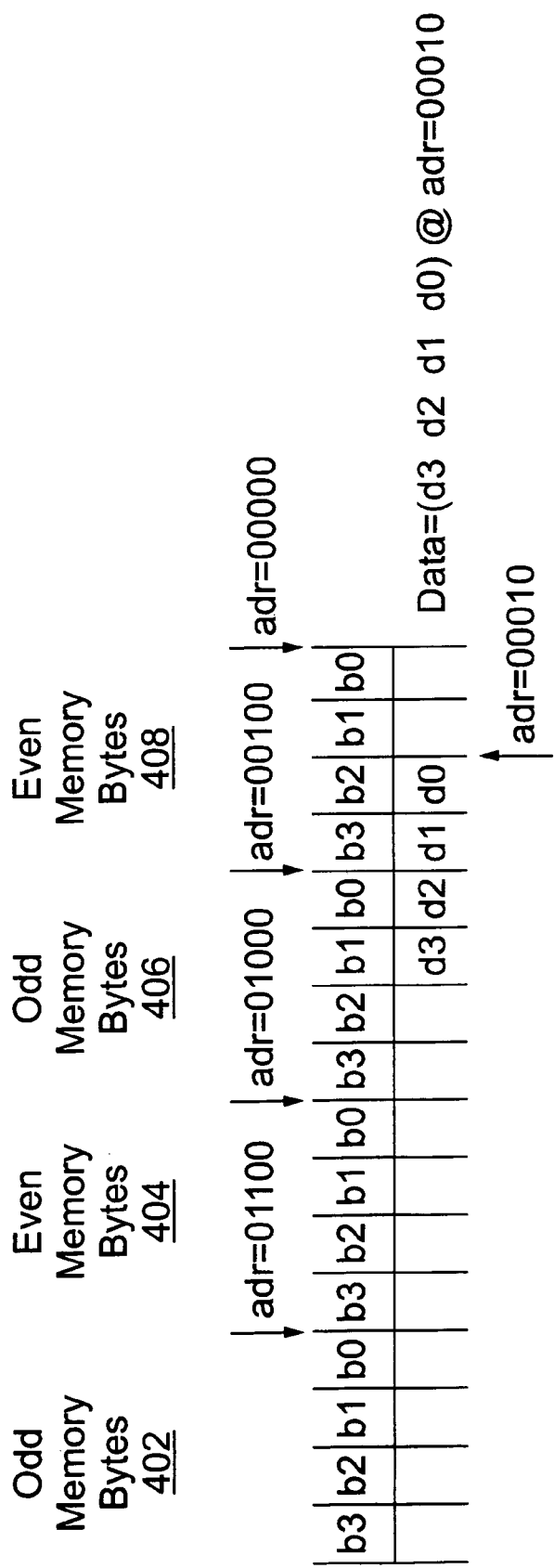
FIGS. 4A–4D depict a first memory access operation according to the present invention.

FIGS. 4A–4D depict the operations of a misaligned data word being written to a system, such as a memory system depicted in FIGS. 1–3. As shown in FIG. 4A, a data variable {d3, d2, d1, d0} can be misaligned with respect to a physical memory having a number of memory locations 402, 404, 406 and 408 with each memory location having four bytes {b3, b2, b1, b0}.

Because the exemplary data variable is offset by two bytes, the low two data variable bytes {d1, d0} can be written to bytes {b3, b2} of memory location 408, while data variable bytes {d3, d2} can be written to memory bytes {b1, b0} of memory location 406.

Figure 4B:
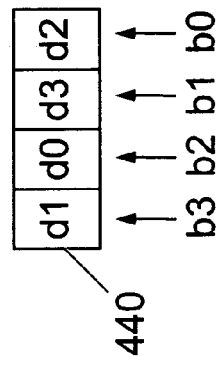
Figure 4C:
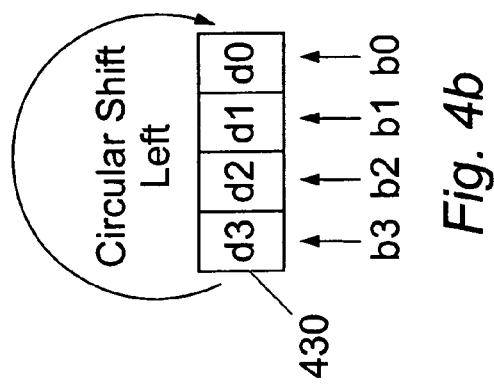
Figure 4D:
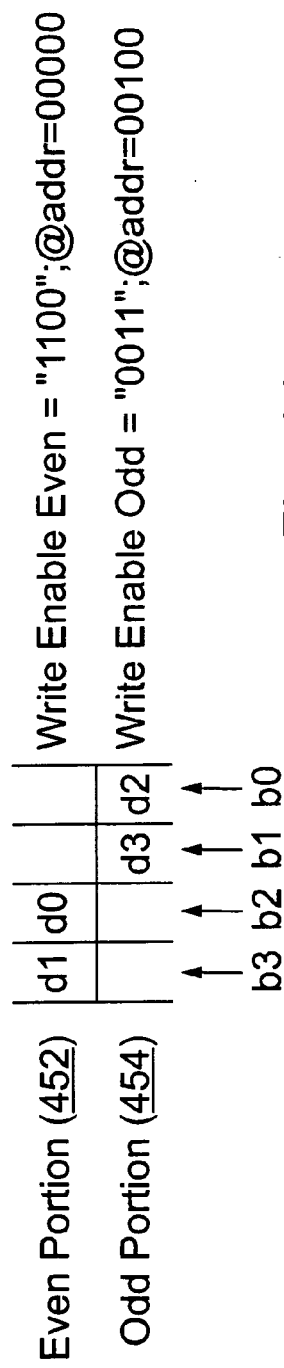

FIG. 4B depicts the data variable 430 {d3, d2, d1, d0} shown in FIG. 4A as it would be presented to a buffering device capable of performing a circular-shift. FIG. 4C depicts a circular-shifted data variable 440 {d1, d0, d3, d2} derived from the data variable 430 {d3, d2, d1, d0} shown in FIG. 4B. FIG. 4D depicts the data variable 430 {d3, d2, d1, d0} shown in FIG. 4A divided into an even portion 452 and an odd portion 454. As shown in FIG. 4D, because only the high two bytes {b3, b2} of the even portion 452 are to be written to, a write enable pattern=–"1100" representing an array of write-enable signals can be provided to an array of individual byte-wide memory cells of an even memory location (at a relative address of "00000") to enable write operations at the appropriate memory cells. Similarly, because only the low two bytes {b1, b0} of the odd portion 454 are to be written, a write enable pattern of "0011" can be similarly applied to another array of memory cells located at a relative address of "0100" to enable write operations at the appropriate odd memory cells.

FIGS. 5A–5D depict a second memory access operation where a misaligned two-byte data variable {d1, d0} is read from a memory array in a single memory-access cycle. As shown in FIG. 4A, the data variable {d1, d0} can be misaligned with respect to a physical memory having a number of memory locations 502, 504, 506 and 508 with each memory location having four bytes {b3, b2, b1, b0}. The exemplary data variable {d1, d0} has an offset of three bytes such that data variable byte {d0} can be read from memory byte {b3} of even memory location 508 and data variable byte {d1} can be read from memory byte {b0} of odd memory location 506.

Figure 5A:
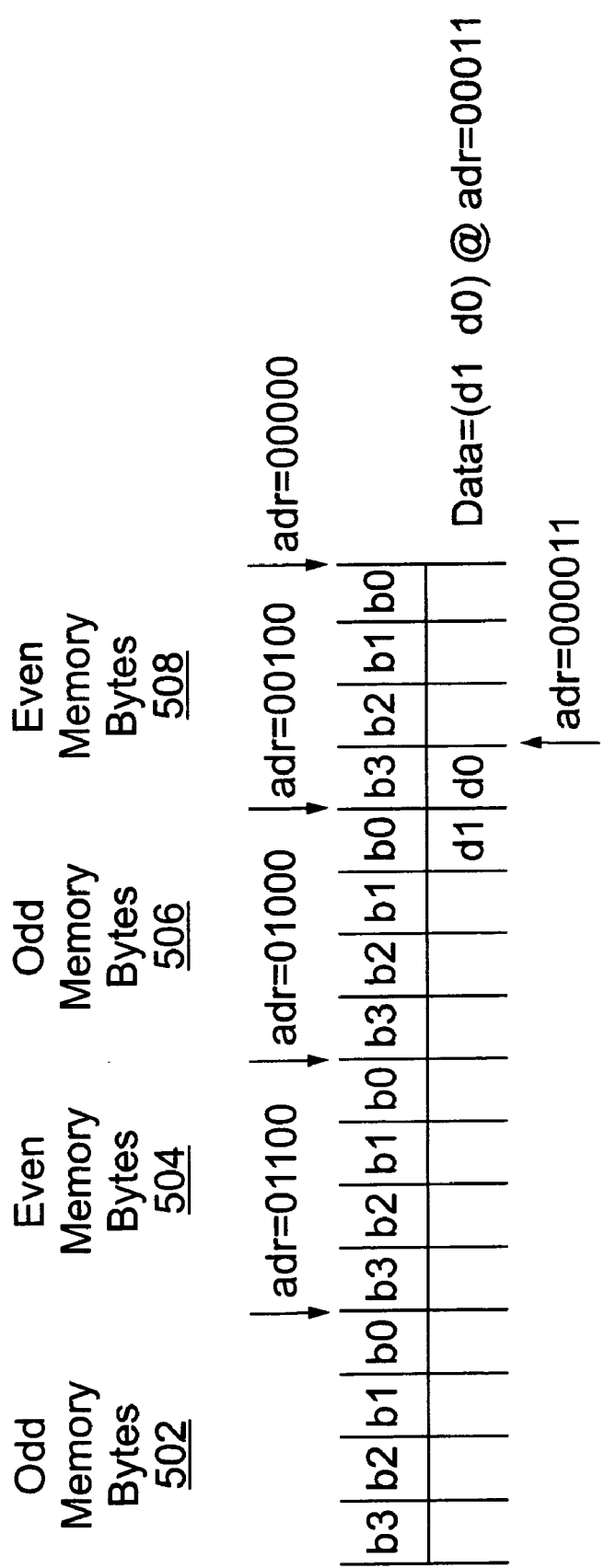

FIG. 5B depicts the data variable {d1, d0} of FIG. 5A as it would be received from a memory array including an even portion 522 and an odd portion 524 with data variable byte {d0} included in the even portion 522 and data variable byte {d1} included in the odd portion 524. Also shown in FIG. 5B, because only the upper byte {b3} of the even portion 522 is to be read, a read enable pattern of "1000" can be applied to an array of byte-wide memory cells of an even memory location. Similarly, because only data byte {b0} is to be read from the odd portion 524, a read enable pattern of "0001" can be applied to an array of byte-wide memory cells of an odd memory location. The x values ("don't care") indicate that we are not concerned with the data of these bytes for the purposes of this explanation. FIG. 5C demonstrates that the received bytes {d1} and {d0} can be received by a device, such as a data buffer block, and combined to form a combined data variable 530 {d0, x, x, d1}. FIG. 5D depicts a combined/shifted data variable 540 {x, x, d1, d0} derived from the combined data variable 530 of FIG. 5C.

As shown in FIGS. 4A–4D and 5A–5D, the respective even and odd enable patterns are disjoint. That is, there are no odd write signals active at the same time their respective even write signals are active. By making the even and odd patterns disjoint, there will be no contention problems during read operations or erroneous write operations, e.g., double writes to bytes in both the first and second memory locations.

Figure 6:
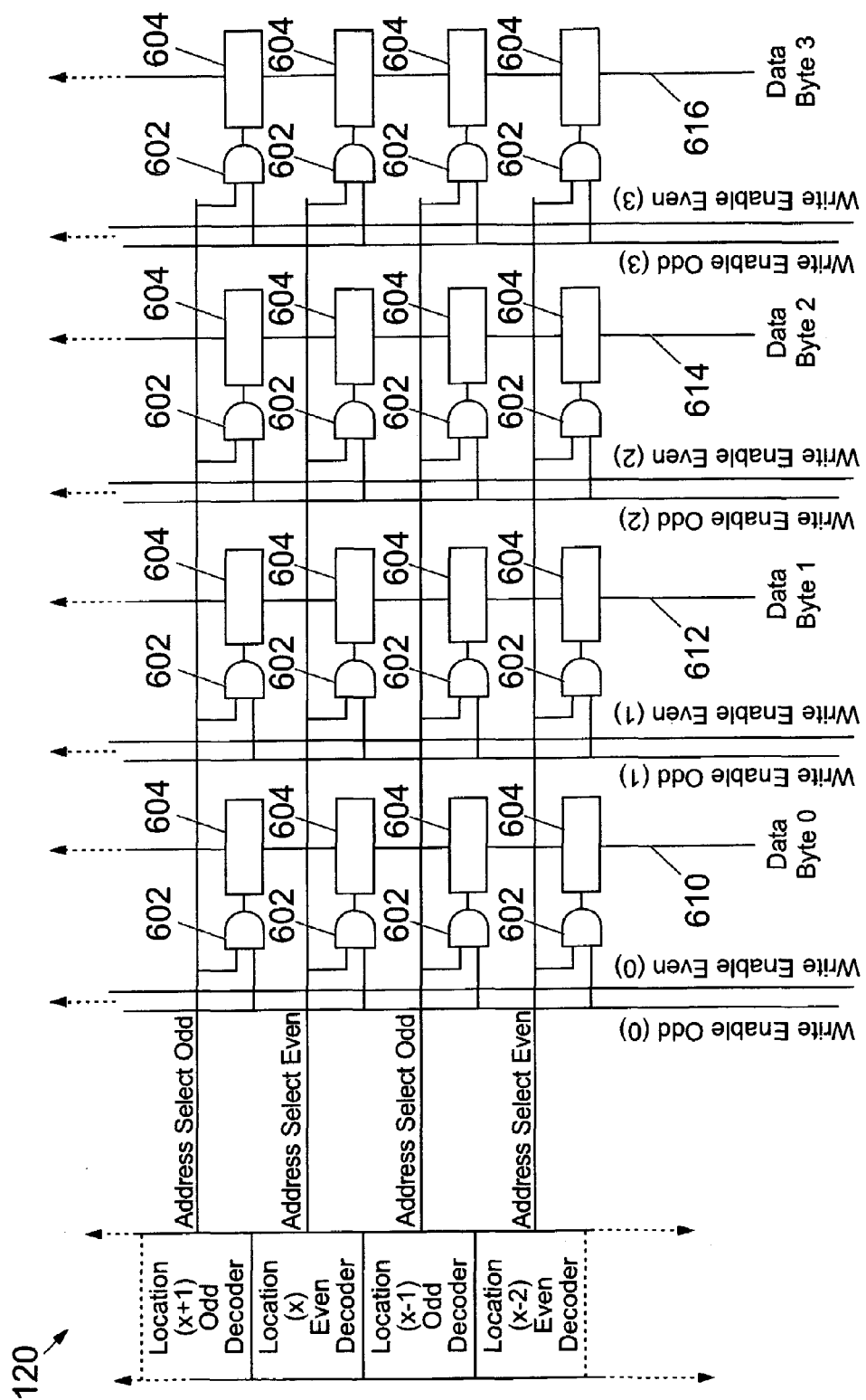
FIG. 6 is a block diagram of the memory array of the system of FIG. 1.

FIG. 6 depicts an exemplary embodiment of the memory array 120 of FIG. 1. As shown in FIG. 6, the memory array 120 contains a number of byte-wide memory cells 604 coupled to a number of respective "AND" gates 602. In operation, each "AND" gate 602 can receive address-selection information in the form of an even or odd address select signal {x–2, x–1, x, x+1}, and further receive write information in the form of one of various available write-enable signals {$WE_{even}[3]$, $WE_{odd}[3]$, $WE_{even}[2]$, $WE_{odd}[2]$, $WE_{even}[1]$, $WE_{odd}[1]$, $WE_{even}[0]$, $WE_{odd}[0]$}.

As the "AND" gates 602 receive their address-selection information and write information, the "AND" gates 602 can produce a logical "AND" operation on the received information and provide the result to their respective memory cells 604. If a particular "AND" gate 602 receives both an active address-select signal and active write-enable signal, the particular "AND" gate 602 can enable its respective memory cell 604 to receive and store data. Accordingly, any data placed on a respective data byte line 610, 612, 614 or 616 can be stored in the enabled memory cells 604.

While FIG. 6 depicts a memory array having the logic required to write data to the various memory cells 604, it should be appreciated that respective read operations can be performed by substituting or complementing the write-enable lines with read-enable lines to receive read-enable information. Accordingly, a particular memory cell 604 can be read-enabled by providing address-selection information and read information to the respective "AND" gate associated with the particular memory cell 604. Any data residing in the particular memory cells 604 could then be placed on the appropriate data byte line 610, 612, 614 or 616.

Figure 7:
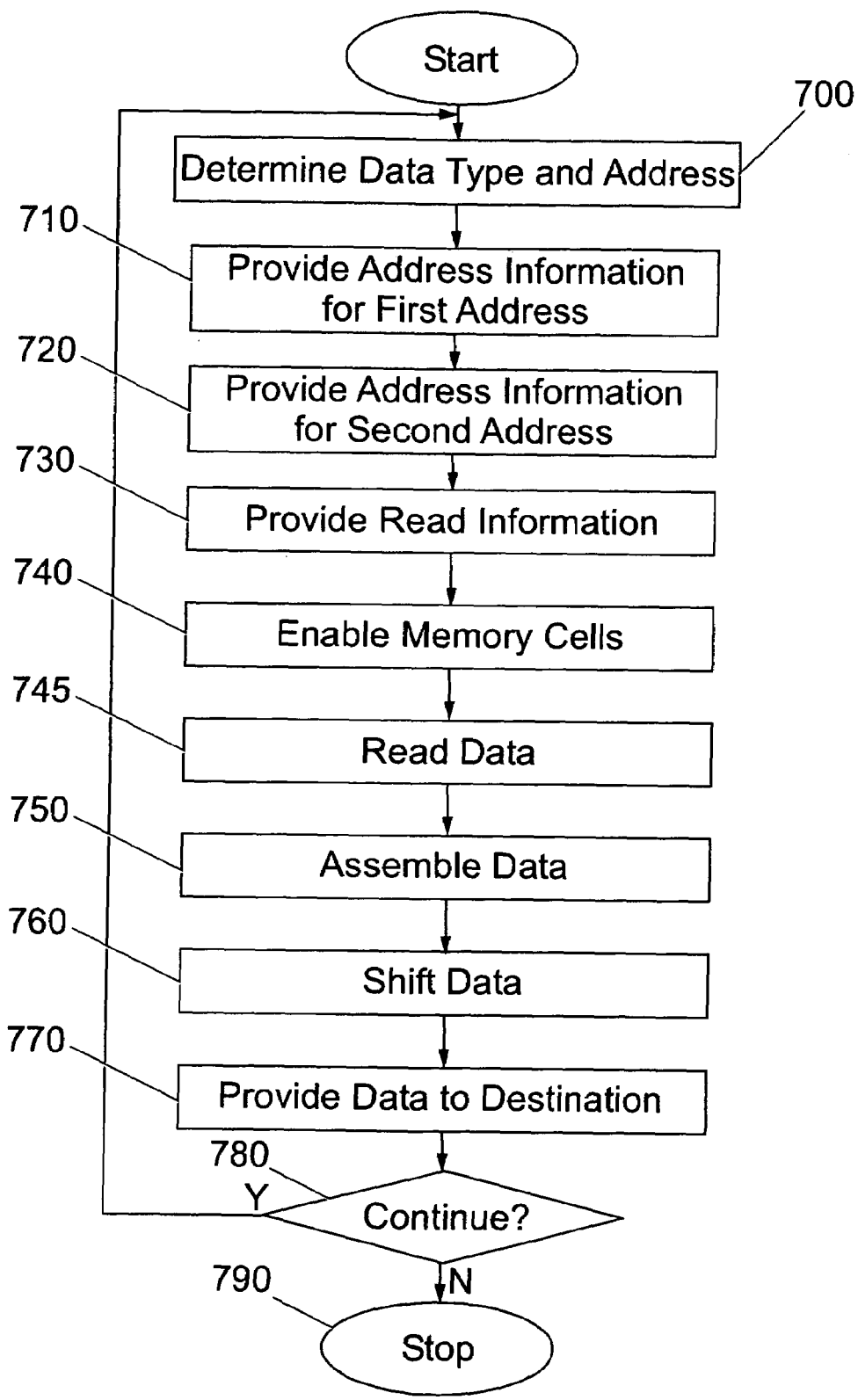
FIG. 7 is a flowchart outlining a first exemplary operation according to the present invention.

FIG. 7 depicts a flowchart outlining a first exemplary memory-access operation directed to reading a misaligned data variable from a memory in a single memory-access cycle. The process starts at step 700 where the size of the data variable to be read as well as the address of the data variable are determined. Next, in step 710, first address-selection information relating to a first address is provided to an array of memory cells, such as the memory cells of the memory system depicted in FIGS. 1–6. Then, in step 720, second address-selection information relating to a second address is provided to the array of memory cells.

As discussed above, the first and second address-selection information can be based on a single received address and, in various embodiments, the second address can be incrementally larger than the first address. Also as discussed above, the first and second address-selection information can be provided within a single memory-access cycle or otherwise contemporaneously provided such that a read operation can be executed in a single memory-access cycle. Control continues to step 730.

In step 730, first and second read information are provided to the first and second memory addresses respectively. Next, in step 740, a first subset of the available memory cells of the first memory address as well as a second subset of the available memory cells of the second memory address are enabled based on the address-selection and read information. Then, in step 745, the first and second enabled memory cells are read. That is, a first portion of the data variable residing in the first enabled memory cells and a second portion of the data variable residing in the second enabled memory cells are received by a device, such as a data buffer. Control continues to step 750.

In step 750, the first and second data portions are assembled into a single data variable. As discussed above, assembling a data variable can include logically combining the data portions by performing a logical "OR" operation. Next, in step 760, the assembled data can be shifted by a predetermined number of bits such that the assembled data can be aligned with the least significant bit/byte of a logical bus or other device. While the exemplary technique uses a shifting operation, as discussed above, it should be appreciated that various other equivalent operations can be performed, such as a multiplexing operation. Control continues to step 770.

In step 770, the assembled/shifted data can be provided to an external device. Next, in step 780, a determination is made as to whether to continue reading data variables. If further data variables are to be read, control jumps back to step 700; otherwise, control continues to step 790 where the process stops.

Figure 8:
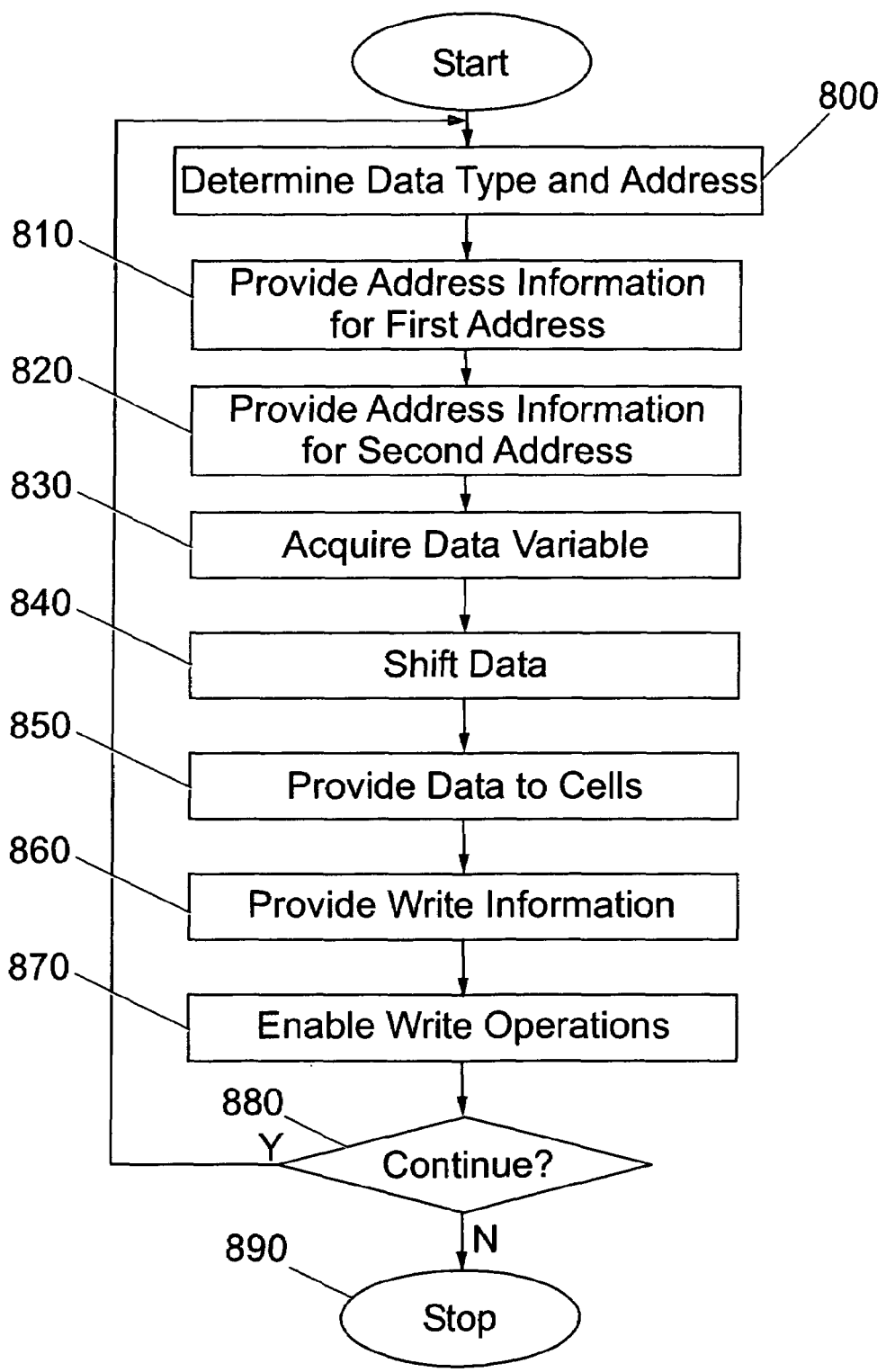
FIG. 8 is a flowchart outlining a second exemplary operation according to the present invention.

FIG. 8 depicts a flowchart outlining a second exemplary operation directed to writing a misaligned data variable to a memory in a single memory-access cycle. As shown in FIG. 8, the process starts at step 800 where the size and address of the data variable are determined. Next, in step 810, first address-selection information relating to a first address is provided to an array of memory cells. Then, in step 820, second address-selection information relating to a second address is provided to the array of memory cells. Control continues to step 830.

In step 830, the data variable of step 800 is acquired by a device, such as a data buffer. Then, in step 840, the data in the data variable can be shifted by a predetermined amount such that a first portion of the data variable can be written to an appropriate number of memory cells associated with the first address and a second portion of the data variable can be written to an appropriate number of memory cells associated with the second address. Next, in step 860, the data of the shifted data variable is divided into first and second portions, and the first and second portions are provided to the appropriate memory cells of the first and second addresses. Control continues to step 860.

In step 860, first and second write information are provided to the first and second memory addresses. Next, in step 870, the appropriate memory cells of the first memory address as well as the appropriate memory cells of the second memory address are enabled to perform write operations, i.e., the appropriate memory cells are enabled to store the data of the data variable. Then, in step 880, a determination is made as to whether to continue to write various data variables. If the operation is to continue, control jumps back to step 800; otherwise, control continues to step 890 where the process stops.

After a particular write operation, it should be appreciated that the various data variables written according to the technique outlined in FIG. 8 may eventually be read. Accordingly, it should be appreciated that the read techniques outlined in FIG. 7 and otherwise described in FIGS. 1–6 can be applied to read the various data variables.

As shown in FIGS. 1–6, the systems and methods of this invention are preferably implemented using dedicated logic or other integrated circuits. However, the systems and methods can also be implemented using any combination of one or more general purpose computers, special purpose computers, program microprocessors or microcontroller and peripheral integrating circuit elements, hardware electronic or logic circuits such as application specific integrated circuits (ASICs), discrete element circuits, programmable logic devices such as PLAs, FPGAs, PALs or the like. In general, any device on which exists a finite state machine capable of implementing the various elements of FIGS. 1–6 and the flowcharts of FIGS. 7 and 8 can be used to implement the sequence of functions.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A method of accessing misaligned memory cells contained within two memory locations in a memory array, the method comprising the steps of:
   (a) receiving address and control information;
   (b) determining an offset between the misaligned memory cells based on the received address and control information;
   (c) enabling a first subset of the misaligned memory cells based on the received address information and the offset, the first subset of the misaligned memory cells contained within a first memory location;
   (d) enabling a second subset of the misaligned memory cells based on the received address information and the offset, the second subset of the misaligned memory cells contained within a second memory location;
   (e) reading a first data portion from the first subset of the misaligned memory cells and reading a second data portion from the second subset of the misaligned memory cells;
   (f) storing the first data portion and the second data portion in a buffer; and
   (g) circularly shifting the first data portion and the second data portion in the buffer to align data in the misaligned data cells;
   wherein the steps (a) to (g) are performed in a single memory access cycle.

2. The method of claim 1, wherein step(e) further comprises:
   assembling the first stored data portion and the second stored data portion to form an aligned data variable, the assembling based on the offset.

3. The method of claim 1, further comprising the step of disassembling a received aligned data variable into a first misaligned data portion and a second misaligned data portion, the disassembling based on the offset.

4. The method of claim 3, further comprising the step of writing the first misaligned data portion to the first subset of the misaligned memory cells and writing the second misaligned data portion to the second subset of the misaligned memory cells.

5. The method of claim 4, wherein the sequence of steps is completed in a single memory access cycle.

6. The method of claim 1, wherein the received address information is a single memory location address.

7. The method of claim 6, wherein the second memory location is incrementally larger than the first memory location.

8. The method of claim 1, wherein the first subset of the misaligned memory cells is disjoint from the second subset of the misaligned memory cells.

9. A memory system for accessing misaligned memory cells contained within two memory locations in a memory array, comprising:
- a memory array containing a first memory location and a second memory location, each memory location containing a plurality of memory cells;
- an address device capable of determining an offset, based on received address and control information, between a first subset of the misaligned memory cells and a second subset of the misaligned memory cells;
- an address selection device capable of resolving the first memory location containing the first subset of the misaligned memory cells and resolving the second memory location containing the second subset of the misaligned memory cells;
- a memory cell enabling device capable of enabling the first subset of the misaligned memory cells and the second subset of the misaligned memory cells; and
- a buffering device capable of performing a circular shift on data contained in the first subset of misaligned memory cells and the second subset of misaligned memory cells.

10. The memory system of claim 9, wherein the address selection device resolves the first memory location and the second memory location based on a single memory location address contained in the received address information.

11. The memory system of claim 10, wherein the second memory location is incrementally larger than the first memory location.

12. The memory system of claim 9, wherein the memory cell enabling device enables the first subset of the misaligned memory cells and the second subset of the misaligned memory cells based on the received address information and the offset.

13. The memory system of claim 9, further comprising write buffer circuitry that disassembles a received aligned data variable into a first data portion and a second data portion based on the offset, the first data portion provided to the first subset of the misaligned memory cells and the second data portion provided to the second subset of the misaligned memory cells.

14. The memory system of claim 9, further comprising read buffer circuitry that assembles an aligned data variable from a first stored data portion and a second stored data portion based on the offset, the first stored data portion retrieved from the first subset of the misaligned memory cells and the second stored data portion retrieved from the second subset of the misaligned memory cells.

* * * * *